(12) United States Patent
Bilaine et al.

(10) Patent No.: US 8,981,360 B2
(45) Date of Patent: Mar. 17, 2015

(54) METHOD FOR MANUFACTURING AN OLED DEVICE

(75) Inventors: Matthieu Bilaine, Paris (FR); Fabien Lienhart, Paris (FR); Li-Ya Yeh, Geilenkirchen (DE); Matthias Alschinger, Herzogenrath (DE)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 13/990,560

(22) PCT Filed: Dec. 19, 2011

(86) PCT No.: PCT/FR2011/053047
§ 371 (c)(1),
(2), (4) Date: May 30, 2013

(87) PCT Pub. No.: WO2012/080684
PCT Pub. Date: Jun. 21, 2012

(65) Prior Publication Data
US 2013/0248846 A1    Sep. 26, 2013

(30) Foreign Application Priority Data

Dec. 17, 2010 (FR) .................... 10 60747

(51) Int. Cl.
| | | |
|---|---|---|
| H01L 29/08 | (2006.01) | |
| H01L 35/24 | (2006.01) | |
| H01L 51/00 | (2006.01) | |
| C03C 17/36 | (2006.01) | |
| H01L 51/52 | (2006.01) | |

(52) U.S. Cl.
CPC ............ *H01L 51/0021* (2013.01); *C03C 17/36* (2013.01); *C03C 17/3618* (2013.01); *C03C 17/3644* (2013.01); *H01L 51/5215* (2013.01); *H01L 51/5203* (2013.01); *C03C 17/3639* (2013.01); *C03C 17/3652* (2013.01); *C03C 17/3655* (2013.01); *C03C 17/3671* (2013.01); *C03C 2218/32* (2013.01); *C03C 2217/948* (2013.01)

USPC .......................................... 257/40

(58) Field of Classification Search
USPC ................ 257/88, 99, 40, 642–643, 759, 257/E51.001–E51.052, E33.059, E21.503; 438/28, 29, 69, 82, 99
See application file for complete search history.

(56) References Cited

U.S. PATENT DOCUMENTS

| | | | |
|---|---|---|---|
| 2003/0180983 A1* | 9/2003 | Oswald et al. ................... | 438/57 |
| 2010/0071810 A1* | 3/2010 | Nadaud et al. ................ | 148/400 |
| 2010/0117523 A1* | 5/2010 | Tchakarov ..................... | 313/504 |
| 2010/0225227 A1* | 9/2010 | Tchakarov et al. ........... | 313/504 |

FOREIGN PATENT DOCUMENTS

| | | |
|---|---|---|
| FR | 2 913 146 | 8/2008 |
| WO | 2008 059185 | 5/2008 |
| WO | 2008 096089 | 8/2008 |
| WO | 2010 142926 | 12/2010 |

OTHER PUBLICATIONS

U.S. Appl. No. 14/003,985, filed Sep. 9, 2013, Bilaine, et al.
International Search Report issued Apr. 3, 2012 in PCT/FR11/053047 filed Dec. 19, 2011.

* cited by examiner

*Primary Examiner* — Dao H Nguyen
*Assistant Examiner* — Tram H Nguyen
(74) *Attorney, Agent, or Firm* — Oblon, McClelland, Maier & Neustadt, L.L.P.

(57) ABSTRACT

The subject of the invention is a process for manufacturing an organic light-emitting diode device comprising at least one electrode based on an electrically conductive thin-film multilayer deposited on a substrate, in which the deposition of said multilayer comprises the following steps:
- a thin-film multilayer comprising at least one thin silver film between at least two thin films is deposited on said at least one face of said substrate; and
- the at least one coated face is heat treated using at least one source of laser radiation emitted at at least one wavelength lying between 500 and 2000 nm so that the sheet resistance of the multilayer decreases by at least 5%.

24 Claims, No Drawings

METHOD FOR MANUFACTURING AN OLED DEVICE

CROSS REFERENCE TO RELATED APPLICATIONS

The present application is a 35 U.S.C. §371 national stage patent application of International patent application PCT/FR2011/053047, filed on Dec. 19, 2011, published as WO 2012/080684 on Jun. 21, 2012, the text of which is incorporated by reference, and claims the benefit of the filing date of French application no. 1060747, filed on Dec. 17, 2010, the text of which is also incorporated by reference.

The invention relates to the field of manufacturing devices comprising organic light-emitting diodes, also called OLEDs.

An OLED comprises an organic light-emitting material, or a multilayer of organic light-emitting materials, and is flanked by two electrodes, one of the electrodes, called the lower electrode, generally the anode, being an electrode associated with the substrate, and the other electrode, called the upper electrode, generally the cathode, being arranged on the organic light-emitting system.

An OLED is a device that emits light via electroluminescence, using the energy released from recombination of holes injected from the anode and electrons injected from the cathode.

There are various OLED configurations:
bottom emission device configuration, i.e. with a (semi) transparent lower electrode and a reflective upper electrode;
top emission device configuration, i.e. with a semi(transparent) upper electrode and a reflective lower electrode; and
devices configured to emit from the top and bottom, i.e. with both a (semi)transparent lower electrode and a (semi)transparent upper electrode.

The invention relates to bottom emission OLED devices and possibly also to top emission OLED devices.

OLEDs are generally employed in displays or in lighting devices.

The resistivity of the lower electrodes must be as low as possible, their optical transmission as high as possible and they must be particularly smooth: an RMS roughness of 2 nm at most, or even 1 nm, is often necessary.

An electrically conductive thin-film multilayer may be used as an electrode, especially a multilayer comprising at least one silver film.

In order in particular to prevent oxidation of the silver and to reduce reflection in the visible, the or each silver film is generally inserted in a film multilayer. The or each silver-based thin film may be placed between two oxide- or nitride-based dielectric thin films (for example made of $SnO_2$ or $Si_3N_4$). A very thin film intended to promote wetting and nucleation of the silver (for example made of zinc oxide ZnO) may also be placed under the silver film, and a second very thin (sacrificial, for example made of titanium) film intended to protect the silver film, in the case where the subsequent film is deposited in an oxidizing atmosphere or in the case where heat treatments that cause oxygen to migrate into the multilayer are used, may be deposited on the silver film. These files are respectively known as the wetting film and the blocking film. The multilayers may also comprise several silver films.

The silver films have the particularity of seeing their resistivity increased when they are in an at least partially crystalline state. Generally, it is sought to maximize the degree of crystallization of these films (the proportion of crystalline material by weight or by volume) and the size of the crystal grains (or the size of coherent diffraction domains measured by X-ray diffraction methods).

It is especially known that silver films having a high degree of crystallization, and therefore containing a low residual amount of amorphous silver, have a lower resistivity and a higher transmission in the visible than silver films that consist mainly of amorphous silver. The electrical conductivity of these films is thus improved. This is because the increase in the grain size is accompanied by a decrease in the number of grain boundaries, increasing the mobility of electrical charge carriers.

A process currently employed, on an industrial scale, to deposit thin films on a glass or polymer substrate, is magnetron sputtering, also called the magnetron process. In this process a plasma is created in a high vacuum in the vicinity of a target comprising the chemical elements to be deposited. The active species of the plasma, by bombarding the target, tear said elements from the target, which elements are deposited on the substrate so as to form the desired thin film. This process is called "reactive" when the film consists of a material resulting from a chemical reaction between the elements torn from the target and the gas contained in the plasma. The major advantage of this process resides in the fact that it is possible to deposit, on a given line, a very complex film multilayer by running the substrate under various targets in succession, this generally being done in one and the same device.

During industrial implementation of the magnetron process, the substrate remains at room temperature or is heated to a moderate temperature (less than 80° C.), particularly when the run speed of the substrate is high (which is generally desirable for economic reasons). Although a high run speed may seem to be advantageous, it however causes a problem in the case of the aforementioned films, because the low temperatures involved do not generally enable sufficient crystalline growth. This is in particular the case for thin films of small thickness and/or films made of materials the melting point of which is very high. Films obtained using this process are therefore mainly, even completely, amorphous or nanocrystalline (the average crystal grain size being smaller than a few nanometers), and heat treatments are therefore required to obtain the desired degree of crystallization or the desired grain size, and therefore the desired low resistivity.

Possible heat treatments consist in heating the substrate either during the deposition, or after the deposition when output from the magnetron line. The closer the temperature of the substrate is to the melting point of the material of the thin film, the better the crystallization and the larger the grain size.

Silver films that are deposited on a hot substrate or subjected to a posterior heat treatment are however especially rough, thereby making them unsuitable for use as OLED-device electrodes.

The aim of the invention is to obviate the aforementioned drawbacks by providing a process capable of obtaining electrically conductive multilayers that combine a low resistivity with a high luminous transmission and a low roughness.

For this purpose, one subject matter of the invention is a process for manufacturing an organic light-emitting diode device comprising at least one electrode based on an electrically conductive thin-film multilayer deposited on a substrate, in which the deposition of said multilayer comprises the following steps:
a thin-film multilayer comprising at least one thin silver film between at least two thin films is deposited on one face of said substrate; and the coated face is heat treated using at least one source of laser radiation emitted at at least one wavelength lying between 500 and 2000 nm so that the sheet resistance of the multilayer decreases by at least 5%.

For a given sheet resistance, the process according to the invention allows thinner silver films to be used, these films therefore having a higher luminous transmission. Inversely, for a given thickness of silver, the films obtained according to the invention have a lower resistivity, while remaining particularly smooth.

Preferably, the multilayer before treatment comprises at least one thin film at least partially absorbing the laser radiation so that the absorption of said multilayer at at least one wavelength of the laser radiation is such that the absorption of a clear glass substrate 4 mm in thickness coated with said multilayer at said at least one wavelength of the laser radiation is greater than or equal to 10%.

The absorption of a substrate coated with the multilayer at a given wavelength is defined as 100% minus the transmission of the coated substrate at the same wavelength and minus the reflection of the same coated substrate at the same wavelength on the multilayer side.

The term "clear glass" is understood to mean a soda-lime-silica glass obtained by the float process, not coated with films, and having a light transmission of around 90%, a light reflection of around 8% and an energy transmission of around 83% for a thickness of 4 mm. The light and energy transmission and reflection are such as defined by the NF EN 410 standard. Typical clear glasses are for example those sold under the name SGG Planilux by Saint-Gobain Glass France or under the name Planibel Clear by AGC Flat Glass Europe.

The process according to the invention is of course not limited to coatings deposited on a clear glass substrate or on a substrate 4 mm in thickness. The coating may be deposited on any type of substrate, but the absorption of the multilayer must be such that if it had been deposited on a clear glass substrate with a thickness of 4 mm, the absorption of this substrate coated with the multilayer would be as claimed.

The process according to the invention makes it possible to deliver sufficient energy to promote crystallization of the thin silver film by a physico-chemical crystalline growth mechanism around seeds already present in the film, while still remaining in the solid phase. The promotion of crystallization of the silver film may especially result in any residues of amorphous phase disappearing and/or the size of the coherent diffraction domains increasing and/or the density of point defects (vacancies or interstitials) or surface or bulk defects, such as twins, decreasing.

The process according to the invention has the advantage of heating only the electrically conductive multilayer, without significantly heating the entire substrate. It is thus no longer necessary for the substrate to undergo slow controlled cooling before the glass is cut or stored. This process also makes it possible to integrate a heater on existing continuous production lines, more particularly in the space located between the outlet of the vacuum deposition chamber of the magnetron line and the device for storing the glass in stacked form. It is also possible in certain cases to carry out the treatment according to the invention within the actual vacuum deposition chamber. Lastly, the process allows substrates made of a polymeric organic substance to be employed.

The use of laser radiation has the advantage of obtaining temperatures generally below 100° C. and even often below 50° C. on the face opposite the first face of the substrate (i.e. on the uncoated face). This particularly advantageous feature is due to the fact that the heat exchange coefficient is very high, typically greater than 400 W/(m²·s). The surface power of the laser radiation on the multilayer to be treated is even preferably greater than or equal 1 kW/cm², especially 10 and even 20 kW/cm².

This very high energy density makes it possible to achieve the desired temperature in the multilayer extremely rapidly (in general, in a time of 1 second or less) and consequently to correspondingly limit the duration of the treatment, the heat generated then not having the time to diffuse into the substrate. Thus, each point in the multilayer is preferably subjected to the treatment according to the invention (and especially heated to a temperature of greater than or equal to 300° C.) for a time generally of less than or equal to 1 second, or even 0.5 seconds. In contrast, since the infrared lamps conventionally used (with no radiation focusing device) are unable to achieve these high power levels per unit area, the treatment time has to be longer to reach the desired temperatures (often lasting several seconds) and the substrate is therefore necessarily heated to high temperatures due to diffusion of the heat, even if the wavelength of the radiation is adapted so as to only be absorbed by the thin film and not by the substrate.

By virtue of the very high heat exchange coefficient associated with the process according to the invention, that part of the glass lying 0.5 mm from the thin film is generally not exposed to temperatures above 100° C. The temperature of the face of the substrate opposite the face treated by the at least one source of laser radiation preferably does not exceed 100° C., especially 50° C. and even 30° C. during the heat treatment.

Most of the energy delivered is therefore "used" by the multilayer so as to improve the crystallization characteristics of the or each silver film that it contains.

The process according to the invention is also improved by the presence in the multilayer before treatment of at least one thin film absorbing the laser radiation sufficiently so that the absorption at at least one wavelength of the laser radiation of a clear glass substrate 4 mm in thickness and coated with the multilayer is greater than or equal to 10%. The multilayer before treatment may comprise one or more of these films that are termed in the rest of the text "absorbent films". The multilayer may for example comprise one absorbent film or else two or three or four, and even five or six, absorbent films. Whatever the number of absorbent films, the important point is that the absorption of the multilayer at the laser wavelength is as claimed. When at least one absorbent film is present, this considerably enhances the effect of the laser treatment: the energy absorbed by the absorbent film is in fact re-emitted close to the silver film, increasing the local temperature at this film. The resulting increase in effectiveness of the laser treatment then helps to improve the resistivity properties of the final multilayer and/or accelerate the treatment and/or use a lower-power and therefore less expensive laser.

To increase the effectiveness of the laser treatment further, the absorption of the multilayer is such that the absorption of a clear glass substrate 4 mm in thickness coated with the multilayer is, before laser treatment, preferably greater than or equal to 12%, or even 13% or 15%, and even 20% or 25% or even 30% at at least one wavelength of the laser radiation.

The degree of crystallization obtained using the process according to the invention is preferably greater than or equal to 20% or 50%, especially 70% and even 90%. This degree of crystallization, defined as being the mass of crystalline material divided by the total mass of material, may be determined by x-ray diffraction using the Rietveld method. Because of the crystallization mechanism through the growth of crystalline grains starting from seeds or nuclei, the increase in the degree of crystallization is generally accompanied by an increase in the size of the crystalline grains or coherent diffraction domains measured by x-ray diffraction.

The improvement in crystallization characteristics also makes it possible to increase the light transmission of the coated substrate by at least 5%, especially 10%, in absolute value, or even 15% and even 20%, again in absolute value (not a relative increase). The light transmission is calculated according to NF EN 410 standard.

Preferably, the sheet resistance of the multilayer is decreased by at least 10%, or 15% or even 20% by the heat treatment. Here, this is a relative decrease, with respect to the sheet resistance value before treatment.

The substrate is preferably made of glass or a polymeric organic substance. It is preferably transparent and colorless (it is then either a clear or extra-clear glass) or colored, for example blue, gray or bronze. The glass is preferably of the soda-lime-silica type, but it may also be a glass of the borosilicate or aluminoborosilicate type. The preferred polymeric organic substances are polycarbonate or polymethylmethacrylate or polyethylene terephthalate (PET), polyethylene naphthalate (PEN), or else fluoropolymers such as ethylene tetrafluoroethylene (ETFE). Advantageously, the substrate has at least one dimension greater than or equal to 1 m, or 2 m or even 3 m. The thickness of the substrate generally varies between 0.025 mm and 19 mm, preferably between 0.4 and mm, especially between 0.7 and 2.1 mm for a glass substrate, and preferably between 0.025 and 0.4 mm and especially between 0.075 and 0.125 mm for a polymer substrate. The substrate may be flat or bent, or even flexible.

The glass substrate is preferably of the float glass type, that is to say able to be obtained by a process consisting in casting molten glass onto a bath of molten tin (called a "float" bath). In this case, the film to be treated may equally well be deposited on the "tin" side as on the "atmosphere" side of the substrate. The terms "atmosphere" side and "tin" side are understood to mean those faces of the substrate that have been in contact with the atmosphere in the float bath and in contact with the molten tin respectively. The tin side contains a small surface amount of tin that has diffused into the structure of the glass. The substrate may also be obtained by rolling between two rollers, which technique makes it possible in particular to imprint features on the surface of the glass.

The electrically conductive multilayer, before or after heat treatment, comprises at least one silver film between at least two films. There is preferably an absorbent film in the multilayer. In the following text, the preferred architecture of the multilayers treated according to the invention will firstly be described, before going into detail about the positioning of the or each absorbent film within such an architecture. Unless indicated otherwise, the thicknesses given are physical thicknesses.

The electrically conductive multilayer, before or after heat treatment, preferably comprises, starting from the substrate, a first coating comprising at least a first dielectric film, at least a silver film, optionally an overblocker film and a second coating comprising at least a second film. The first and second coatings advantageously serve as a barrier layer to moisture and gases, especially when the substrate is made of an organic, for example flexible, polymer, or when the substrate is associated with a lamination interlayer.

Preferably, the physical thickness of the or each silver film is between 6 and 20 nm.

The overblocker film is intended to protect the silver film during deposition of a subsequent film (for example if this is deposited in an oxidizing or nitriding atmosphere) and during any further heat treatment.

The silver film may also be deposited on and in contact with an underblocker film. The multilayer may therefore comprise an overblocker film and/or an underblocker film flanking the or each silver film.

Blocker (underblocker and/or overblocker) films are generally based on a metal chosen from nickel, chromium, titanium, niobium or an alloy of these various metals. Mention may in particular be made of nickel-titanium alloys (especially those containing about 50% of each metal by weight) and nickel-chromium alloys (especially those containing 80% nickel by weight and 20% chromium by weight). The overblocker film may also consist of several superposed films; for example, on moving away from the substrate, a titanium film and then a nickel alloy (especially a nickel-chromium alloy) film, or vice versa. The various metals or alloys cited may also be partially oxidized, and may especially be oxygen substoichiometric (for example $TiO_x$ or $NiCrO_x$).

These blocker (underblocker and/or overblocker) films are very thin, normally having a thickness of less than 1 nm, so as not to affect the light transmission of the multilayer, and can be partially oxidized during the heat treatment according to the invention. As indicated in the rest of the text, the thickness of at least one blocker film may be higher, so as to constitute an absorbent film according to the invention. In general, the blocker films are sacrificial films capable of capturing oxygen coming from the atmosphere or from the substrate, thus preventing the silver film from oxidizing.

The first dielectric film is typically an oxide (especially tin oxide), or preferably a nitride, especially silicon nitride. In general, the silicon nitride may be doped, for example with aluminum or boron, so as to make it easier to deposit it by sputtering techniques. The degree of doping (corresponding to the atomic percentage relative to the amount of silicon) generally does not exceed 2 at %. The function of these dielectric films is to protect the silver film from chemical or mechanical attack and they also influence the optical properties, especially in reflection, of the multilayer, through interference phenomena.

The first coating may comprise one dielectric film or a plurality, typically 2 to 3. These dielectric films are preferably made of a material chosen from silicon nitride, titanium oxide, tin oxide and zinc oxide, or any of their mixtures or solid solutions, for example a tin zinc oxide, or a titanium zinc oxide. The physical thickness of the dielectric film, or the overall physical thickness of all the dielectric films, is preferably between 15 and 60 nm, especially between 20 and 50 nm.

The first coating preferably comprises, immediately beneath the silver film or beneath the optional underblocker film, a wetting film, the function of which is to increase the wetting and bonding of the silver film. Zinc oxide, especially when doped with aluminum, proves to be particularly advantageous in this regard.

The first coating may also contain, directly beneath the wetting film, a smoothing film, which is a partially or completely amorphous mixed oxide (and therefore one having a very low roughness), the function of which is to promote growth of the wetting film in a preferential crystallographic orientation, thereby promoting silver crystallization through epitaxial phenomena. The smoothing film is preferably composed of a mixed oxide of at least two metals chosen from Sn, Zn, In, Ga and Sb. A preferred oxide is antimony-doped zinc tin oxide.

In the first coating, the wetting film or the optional smoothing film is preferably deposited directly on the first dielectric film. The first dielectric film is preferably deposited directly on the substrate. For optimally adapting the optical properties (especially the appearance in reflection) of the multilayer, the first dielectric film may as an alternative be deposited on another oxide or nitride film, for example a titanium oxide or silicon nitride film.

Within the second coating, the second film, which is preferably conductive, may be deposited directly on the silver film or preferably on an overblocker, or else on other oxide or nitride films intended for adapting the optical properties of the multilayer. For example, a zinc oxide film, especially one doped with aluminum, or a tin oxide film, or a zinc tin oxide film may be placed between an overblocker and the second film. Zinc oxide, especially aluminum-doped zinc oxide, helps to improve the adhesion between the silver and the upper films.

Thus, the multilayer treated according to the invention preferably comprises at best a ZnO/Ag/ZnO succession. The zinc oxide may be doped with aluminum. An underblocker film may be placed between the silver film and the subjacent film. Alternatively or additionally, an overblocker film may be placed between the silver film and the superjacent film.

Finally, the second coating may be surmounted by an overcoat intended to protect the multilayer from any mechanical attack (scratches, etc.) or chemical attack. This overcoat is generally very thin so as not to affect the appearance in reflection of the multilayer (its thickness is typically between 1 and 5 nm). It is preferably based on titanium oxide or a mixed tin zinc oxide, especially one doped with antimony, deposited in substoichiometric form. As indicated below, the composition of this overcoat may be chosen so that it is the absorbent film or an absorbent film of the multilayer.

Preferably, the last film of the multilayer is made of a transparent conductive oxide with a high work function, such as an indium oxide and at least one element chosen from tin and zinc (ITO, IZO or ITZO films).

The multilayer may comprise one or more silver films, especially two or three silver films. Where more than one silver film is present, the general architecture presented above may be repeated. In this case, the second coating relating to a given silver film (and therefore located above this silver film) generally coincides with the first coating relating to the next silver film.

The multilayer before heat treatment preferably comprises at least one absorbent film. A thin absorbent film may be in direct contact with the silver film so as to improve the transfer of energy re-emitted toward the silver film. A thin absorbent film may especially be located beneath the silver film (i.e. closer to the substrate) and/or on top of the silver film.

According to a first preferred embodiment, a thin film at least partially absorbing the laser radiation is a metallic film deposited directly on top of the silver film (the overblocker film) or directly beneath the silver film (the underblocker film), and the thickness of which is between 2 and 5 nm, especially between 3 and 5 nm. This blocker film is partially oxidized during the laser treatment, creating a generally oxygen-substoichiometric oxide having a reduced light absorption. Thinner films do not have sufficient absorption for energy transfer to the silver film to be perceptible. Furthermore, thinner films have a tendency to be completely oxidized during the laser treatment, resulting in poor mechanical strength of the final multilayer. The thickness range described, unusual because it is larger than the typical thickness of blocker films, is therefore particularly well suited to the treatment according to the invention. As regards the chemical nature of the blocker films, what is described above also applies to the case in which the blocker film is an absorbent film according to the invention.

According to a second preferred embodiment, a thin film at least partially absorbing the laser radiation is a nitride film, especially one that is stoichiometric or nitrogen-substoichiometric. The stoichiometric nitride is preferably titanium nitride which has a high absorption in the wavelength range of the laser. The nitrogen-substoichiometric nitride is preferably chosen from substoichiometric silicon, aluminum, titanium or niobium nitrides, or any of their mixtures. The absorbing nitride film preferably has a thickness of between 2 and 10 nm, especially between 2 and 5 nm.

According to a third preferred embodiment, a thin film at least partially absorbing the laser radiation is a film made of a metal, an oxygen-substoichiometric metal oxide or a metal nitride. In the context of the general architecture presented above, this is therefore the overcoat. This overcoat generally oxidizes during the laser treatment, so that its light absorption after treatment will be very low. The thickness of this overcoat in contact with the air is preferably less than or equal to 5 nm or less than or equal to 3 nm, but greater than or equal to 1 nm. A thickness as small as this is generally sufficient to obtain the desired absorption. A small thickness also allows complete oxidation after the treatment according to the invention and therefore results in high light transmissions. The metal is preferably chosen from silicon, niobium, titanium, aluminum, zinc, tin, nickel and zirconium, or any of their alloys. Preferably, the oxygen-substoichiometric oxide is a silicon, niobium, titanium, aluminum, zinc, tin or zirconium oxide or any of their mixtures. The nitride may be stoichiometric, and in this case it is preferably a titanium nitride. The nitride may also be substoichiometric: it may then be a silicon, aluminum, titanium, niobium, zinc, tin or zirconium nitride, or any of their mixtures.

According to a fourth preferred embodiment, a thin film at least partially absorbing the laser radiation is a film of an oxygen-substoichiometric metal oxide, located beneath and preferably in contact with the or each silver film and/or located on and preferably in contact with the or each silver film. In particular, it may be a wetting film, as defined above. The oxygen-substoichiometric oxide is preferably chosen from zinc oxide, titanium oxide and tin oxide, or one of their mixtures.

According to a fifth preferred embodiment, a thin film at least partially absorbing the laser radiation is a carbon-based film in contact with the air. Preferably, the carbon is of the graphite or amorphous type and/or contains at least 50% or even 100% sp2 carbon. The thin carbon-based film preferably consists of carbon but may however be doped with a metal or may be partially hydrogenated. The thickness of the carbon film is preferably less than 5 nm, especially 2 nm and even 1 nm. Carbon has a high absorbent capacity in the visible and in the infrared. The carbon film, most particularly when it is predominantly sp2 hybridized carbon, especially of the graphite or amorphous type, is, more particularly when it has a small thickness, eliminated during the treatment, probably by being oxidized to carbon dioxide, which evaporates, so that the residual absorption after treatment is minimal. The thin carbon-based film may be obtained by various techniques, especially by magnetron sputtering, for example using a graphite target in an argon atmosphere. Other deposition processes include CVD (chemical vapor deposition), arc deposition, evaporation deposition and sol-gel processes.

According to a sixth preferred embodiment, an absorbing film is a film of indium oxide and at least one element chosen from tin and zinc. This film is generally the last film of the multilayer (the film furthest from the substrate). It is in particular an ITO film.

Whatever its position in the multilayer, the absorbent film or one such film may also be based on an oxide doped with at least one ion of a transition metal (for example, iron, chromium, vanadium, manganese, cobalt, nickel or copper) or of a rare earth (for example, neodymium or europium).

The treated multilayer may comprise a single absorbent film. It may also comprise more absorbent films, for example two, three, four or five such films, in particular if the presence of a single absorbent film is not sufficient to achieve the desired absorption of the overall multilayer. The multilayer may therefore be chosen so that it contains a plurality of absorbent films which, when combined, make it possible to achieve the desired absorption but which, individually, do not do so. This is particularly the case for multilayers comprising more than one silver film, especially two or three silver films: the increase in number of blockers (underblockers and/or overblockers) may result in a high absorption at the wavelength of the laser, whereas each of the films by itself does not have a thickness sufficient to achieve this absorption.

In order for the absorption of the laser radiation by the multilayer to be further improved, it may therefore comprise several types of absorbent films as described above. Each of the preferred embodiments that have been described may especially be combined with one or more other embodiments. In particular, the following preferred embodiments may be combined: 1 and 2; 1 and 3; 1 and 4; 1 and 5; 1 and 6; 2 and 3; 2 and 4; 3 and 4; 2 and 5; 2 and 6; 3 and 5; 3 and 6; 1, 2 and 3; 1, 2 and 4; 1, 2 and 5; 1, 2 and 6; 1, 3 and 4; 1, 3 and 5; 1, 3 and 6; 2, 3 and 4; 2, 3 and 5; 2, 3 and 6; 3, 4 and 5; 3, 4 and 6; 4, 5 and 6; 1, 2, 3 and 4; 1, 2, 3 and 5; 1, 2, 3 and 6; 1, 2, 4 and 5; 1, 2, 4 and 6; 1, 3, 4 and 5; 1, 3, 4, 5 and 6; 2, 3, 4 and 5; 2, 3, 4, 5 and 6; and 1, 2, 3, 4, 5 and 6. As an example, the multilayer may comprise one thickened blocker film (with a thickness between 2 and 5 nm) and one absorbent overcoat (a combination of the first and third preferred embodiments). Certain preferred embodiments may also be combined with themselves. This is so in the case of the second preferred embodiment, in the sense that the multilayer may comprise a plurality of nitride absorbent films. Likewise, the multilayer may comprise a plurality of blocker (underblocker and/or overblocker) films that have been thickened so as to increase their absorption of the laser radiation (combinations of the first embodiment).

A few nonlimiting examples of multilayers that can be treated according to the invention are described below. The films are indicated in the order of deposition starting from the substrate.

Multilayer 1: $Si_3N_4/SnZnO_x/ZnO/Ag/Ti/ITO$; and
Multilayer 2: $Si_3N_4/SnZnO_x/ZnO/Ag/Ti/ZnO/SnZnO_x/ZnO/Ag/Ti/ITO$ In the case of multilayer 1, an absorbent film is formed by the overblocker (here made of titanium, but the metals or alloys mentioned above may be used) when it is thickened and by the ITO film. This multilayer therefore illustrates the first and sixth preferred embodiments.

Multilayer 2 illustrates a multilayer comprising two silver films.

In the multilayers presented above, at least one zinc oxide film may also be oxygen-substoichiometric and constitute an absorbent film illustrating the fourth preferred embodiment.

The RMS roughness of the multilayer is preferably 2 nm at most, especially 1 nm, both before and after the treatment.

The treatment according to the invention is generally carried out using a source of radiation having a well-defined wavelength. However, the invention does not exclude the use of a number of different lasers so that the coated substrate experiences the action of a plurality of radiation sources having different wavelengths.

The wavelength of the radiation is preferably between 530 and 1000 nm, or between 600 and 1000 nm, especially between 700 and 990 nm, or even between 800 and 990 nm, since silver reflects this type of radiation less than infrared radiation of longer wavelength. The treatment is therefore more effective. Furthermore, the substrate, if it is made of clear glass, absorbs less in this wavelength range and is then less apt to undergo high temperatures.

Laser diodes, for example emitting at a wavelength of about 808 nm, 880 nm, 915 or even 940 nm or 980 nm, are preferably used. Very high powers can be obtained by systems of diodes, allowing powers per unit area greater than 1 $kW/cm^2$ or even greater than 10 or even 20 $kW/cm^2$ to be achieved in the multilayer to be treated.

For greater implementation simplicity, the lasers employed in the context of the invention may be fiberized, which means that the laser radiation is injected into an optical fiber and then delivered close to the surface to be treated via a focusing head. The laser may also be a fiber laser, in the sense that the amplifying medium is itself an optical fiber.

The laser beam may be a point laser beam, in which case it is necessary to provide a system for moving the laser beam in the plane of the substrate.

Preferably however, the laser radiation is emitted by at least one laser beam forming a line, called a "laser line" in the rest of the text, which simultaneously irradiates all or part of the width of the substrate. This embodiment is preferred as it avoids the use of expensive moving systems, which are generally bulky and difficult to maintain. The in-line laser beam may especially be obtained using systems of high-power laser diodes combined with focusing optics. The thickness of the line is preferably between 0.01 and 1 mm. The length of the line is typically between 5 mm and 1 m. The profile of the line may especially be a Gaussian curve or have a "top hat" configuration.

The laser line simultaneously irradiating all or part of the width of the substrate may be made up of a single line (in which case it irradiates the entire width of the substrate) or a plurality of optionally separate lines. When a plurality of lines is used, it is preferable for each line to be placed so that the entire area of the multilayer is treated. The or each line is preferably placed so as to be perpendicular to the run direction of the substrate or placed obliquely. The various lines may treat the substrate simultaneously or in a delayed manner. The important point is that the entire surface is treated.

To treat the entire surface of the film, a relative movement is preferably induced between, on the one hand, the substrate coated with the film and the or each laser line. The substrate may thus be moved, especially so as to run translationally past the stationary laser line, generally beneath it, but optionally above said laser line. This embodiment is particularly advantageous for a continuous treatment. Alternatively, the substrate may be stationary and the laser may be moved. Preferably, the difference between the respective speeds of the substrate and the laser is greater than or equal to 1 meter per minute, or 4 meters per minute or even 6, 8, 10 or 15 meters per minute, so as to ensure a high treatment rate. According to the invention, by judiciously choosing certain films of the multilayer it is possible to achieve a very great reduction in the resistivity for high run speeds and therefore high treatment rates.

When it is the substrate that is moving, especially translationally, it may be moved using any mechanical conveying means, for example belts, rollers or trays running translationally. The conveying system is used to control and regulate the run speed. If the substrate is made of a flexible polymeric organic substance, it may be moved using a film advance system in the form of a succession of rollers.

The laser may also be moved so as to adjust its distance from the substrate, which may in particular be useful when the substrate is bent, but not only in such a case. Indeed, it is preferable for the laser beam to be focused onto the coating to be treated so that the latter is located at a distance of less than or equal to 1 mm from the focal plane. If the system for moving the substrate or moving the laser is not sufficiently precise as regards the distance between the substrate and the focal plane, it is preferable to be able to adjust the distance between the laser and the substrate. This adjustment may be automatic, especially regulated using a distance measurement upstream of the treatment.

When the laser line is moving, it is necessary to provide a system for moving the laser, located above or beneath the substrate. The duration of the treatment is regulated by the run speed of the laser line.

Of course, all relative positions of the substrate and the laser are possible provided that the surface of the substrate can be suitably irradiated. More generally, the substrate is placed horizontally, but it may also be placed vertically, or at any possible inclination. When the substrate is placed horizontally, the laser is generally placed so as to irradiate the top side of the substrate. The laser may also irradiate the underside of the substrate. In this case, it is necessary for the substrate support system, and optionally the substrate conveying system when the substrate is moving, to let the radiation into the zone to be irradiated. This is the case for example when conveying rollers are used. Since the rollers are separate entities, it is possible to have the laser pass into a zone located between two successive rollers.

When both sides of the substrate are to be treated, it is possible to employ a number of lasers located on either side of the substrate, whether the latter is in a horizontal, vertical or any inclined position.

The radiation device, for example the in-line laser, may be integrated into a film deposition line, for example a magnetron sputtering line or a chemical vapor deposition (CVD) line, especially a plasma-enhanced (PECVD) line, under vacuum or at atmospheric pressure (AP-PECVD). In general, the line includes substrate handling devices, a deposition unit, optical control devices and stacking devices. For example, the substrates run on conveyor rollers, in succession past each device or each unit.

The radiation device, for example the in-line laser, is preferably located just after the film deposition unit, for example at the exit of the deposition unit. The coated substrate may thus be treated in line after the film has been deposited, at the exit of the deposition unit and before the optical control devices, or after the optical control devices and before the substrate stacking devices.

The radiation device may also be integrated into the deposition unit. For example, the laser may be introduced into one of the chambers of a sputtering deposition unit, especially in a chamber in which the atmosphere is rarefied, especially at a pressure between $10^{-6}$ mbar and $10^{-2}$ mbar. The laser may also be placed outside the deposition unit, but so as to treat a substrate located inside said unit. For this purpose, all that is required is to provide a window transparent to the wavelength of the radiation used, through which the laser beam passes to treat the film. It is thus possible to treat a film (for example a silver film) before the subsequent deposition of another film in the same unit. When an absorbent film is an overcoat, for example made of metal, its oxidation during the treatment may be impeded if the substrate is placed in a vacuum chamber. It is possible in this case to treat the multilayer in a special chamber, in which the oxidizing atmosphere is controlled.

Whether the radiation device is outside the deposition unit or integrated thereinto, these "in-line" processes are preferable to a process involving off-line operations, in which it would be necessary to stack the glass substrates between the deposition step and the heat treatment.

However, processes involving off-line operations may have an advantage in cases in which the heat treatment according to the invention is carried out in a place different from that where the deposition is carried out, for example in a place where conversion of the glass takes place. The radiation device may therefore be integrated into lines other than the film deposition line. For example, it may be integrated into a multiple glazing (especially double or triple glazing) manufacturing line or into a laminated glazing manufacturing line. In these various cases, the heat treatment according to the invention is preferably carried out before the multiple glazing or laminated glazing is produced.

The multilayer may be deposited on the substrate by any type of process, in particular processes generating predominantly amorphous or nanocrystalline films, such as the sputtering, especially magnetron sputtering, process, the plasma-enhanced chemical vapor deposition (PECVD) process, the vacuum evaporation process or the sol-gel process.

Preferably, the multilayer is deposited by sputtering, especially magnetron sputtering.

For greater simplicity, the laser treatment of the film preferably takes place in air and/or at atmospheric pressure. However, it is possible for the heat treatment of the film to be carried out within the actual vacuum deposition chamber, for example before a subsequent deposition.

Preferably, the laser treatment is such that each point on the thin film is raised to a temperature of at least 300° C., while keeping any point on that face of said substrate opposite said first face at a temperature not exceeding 100° C., so as to increase the rate of crystallization of said thin film, keeping it continuous, and without a step in which said thin film melts. The thin film therefore remains continuous as a result of the treatment.

The expression "continuous thin film" is understood in the context of the present invention to mean that the film covers substantially the entire substrate or, in the case of a multilayer, the entirety of the subjacent film. It is important that the continuous character of the thin film (and therefore its advantageous properties) be preserved by the treatment according to the invention.

The expression "a point on the film" is understood to mean an area of the film undergoing the treatment at a given instant. According to the invention, the entire film (and therefore each point) is raised to a temperature of at least 300° C., but each point on the film is not necessarily treated simultaneously. The film may be treated in its entirety at the same instant, each point on the film being simultaneously raised to a temperature of at least 300° C. Alternatively, the film may be treated so that the various points on the film or groups of points are heated in succession to a temperature of at least 300° C., this second embodiment being more often employed in the case of continuous implementation on an industrial scale.

The process according to the invention may be carried out on a substrate placed either horizontally or vertically. It may also be carried out on a substrate provided with thin films on both its faces, at least one film on one of the faces or on each face being treated according to the invention. If thin films deposited on both faces of the substrate are treated according to the invention, it is possible for said thin films to be treated on each face either simultaneously or in succession, by the same or different techniques, in particular depending on whether the nature of the treated films is the same or different. The case in which the treatment according to the invention is carried out simultaneously on both faces of the substrate is therefore well within the scope of the invention.

Another subject of the invention is an organic light-emitting diode device capable of being obtained by a process according to the invention.

The invention will be illustrated using the following non-limiting examples.

EXAMPLE 1

A silver-based multilayer acting as an electrode for an organic light-emitting component was deposited by sputtering on a 1.6 mm-thick glass substrate sold under the trade name SGG Planilux by the Applicant.

The films forming the multilayer and their respective geometric thicknesses are indicated in table 1 below. The first film in the table is the first film deposited on the substrate.

TABLE 1

| Film | Thickness (nm) |
| --- | --- |
| $Si_3N_4$ | 30 |
| $SnZnO_x$ | 5 |
| ZnO | 5 |
| Ag | 8.75 |
| Ti | <1 |
| ZnO | 5 |
| $SnZnO_x$ | 60 |
| ZnO | 5 |
| Ag | 8.75 |
| Ti | <1 |
| ITO | 20 |

The sheet resistance before treatment was 2.45 ohms.

The substrate coated with its multilayer was then treated using an in-line laser emitting radiation at a wavelength of 980 nm, opposite which the coated substrate was run translationally with a speed of 8 meters per minute. The power density of the laser line was 40 kW/cm². The sheet resistance after treatment was 2.33 ohms, i.e. a decrease of 50. The RMS roughness of the multilayer remained below 1 nm after treatment.

EXAMPLE 2

A silver-based multilayer acting as an electrode for an organic light-emitting component of the same type as example 1 was deposited by sputtering on a 0.7 mm-thick glass substrate.

The sheet resistance of the multilayer before treatment was 3.3 ohms.

The substrate coated with its multilayer was then treated using an in-line laser emitting radiation at a wavelength of 980 nm having a power density of 50 kW/cm², opposite which the coated substrate was run translationally with a speed of 13 meters per minute. The sheet resistance after treatment was 2.43 ohms, i.e. a decrease of 24.5%.

The RMS roughness of the multilayer remained below 1 nm after treatment.

EXAMPLE 3

A silver-based multilayer acting as an electrode for an organic light-emitting component of the same type as example 1 was deposited by sputtering on a 2.1 mm-thick glass substrate.

The sheet resistance of the multilayer before treatment was 4.87 ohms.

The substrate coated with its multilayer was then treated using an in-line laser emitting radiation at a wavelength of 980 nm, opposite which the coated substrate was run translationally with a speed of 19 meters per minute. The power density of the laser line was 50 kW/cm². The sheet resistance after treatment was 3.95 ohms, i.e. a decrease of 19.

The RMS roughness of the multilayer remained below 1 nm after treatment.

The invention claimed is:

1. A process for manufacturing an electrode suitable for use in an organic light-emitting diode comprising an electrically conductive thin-film multilayer deposited on a substrate, the process comprising:
   depositing a thin-film multilayer comprising a thin silver film between at least two thin films on one face of the substrate, to obtain a coated face on the substrate; and
   heat treating the coated face of the substrate with a source of laser radiation emitting a wavelength from 500 to 2000 nm, such that the sheet resistance of the multilayer decreases by at least 5%; and
   wherein
   (i) the multilayer is deposited by magnetron sputtering; or
   (ii) wherein, prior to the heat treatment, the multilayer comprises a thin film that at least partially absorbs the laser radiation such that the absorption of the multilayer at the wavelength of the laser radiation is such that the absorption of a clear glass substrate 4 mm in thickness coated with the multilayer at the wavelength of the laser radiation is greater than or equal to 10%; or
   (iii) wherein the substrate comprises polyethylene terephthalate or polyethylene naphthalate;
   thereby manufacturing said electrode.

2. The process of claim 1, wherein, prior to the heat treatment, the multilayer comprises a thin film that at least partially absorbs the laser radiation such that the absorption of the multilayer at the wavelength of the laser radiation is such that the absorption of a clear glass substrate 4 mm in thickness coated with the multilayer at the wavelength of the laser radiation is greater than or equal to 10.

3. The process of claim 1, wherein the temperature of the face of the substrate opposite the face treated by the source of laser radiation does not exceed 100° C. during the heat treatment.

4. The process of claim 1, wherein the heat treatment decreases the sheet resistance of the multilayer by at least 15%.

5. The process of claim 1, wherein the substrate comprises glass or a polymeric organic substance.

6. The process of claim 5, wherein the substrate comprises polyethylene terephthalate or polyethylene naphthalate.

7. The process of claim 2, wherein the thin film that at least partially absorbs the laser radiation is a metallic film deposited directly on top of the silver film or directly beneath the silver film,
   wherein the thickness of the metallic film is from 2 to 5 nm, and
   wherein the metallic film comprising titanium, nickel, chromium, niobium, or any alloy thereof.

8. The process of claim 2, wherein the thin film that at least partially absorbs the laser radiation is a nitride.

9. The process of claim 2, wherein the thin film that at least partially absorbs the laser radiation is a film comprising a metal, an oxygen-substoichiometric metal oxide, or a metal nitride.

10. The process of claim 2, wherein the thin film that at least partially absorbs the laser radiation is an oxygen-substoichiometric metal oxide, located beneath silver film, or located on the silver film.

11. The process of claim 2, wherein the thin film that at least partially absorbs the laser radiation is a carbon-comprising film in contact with air.

12. The process of claim 2, wherein the thin film that at least partially absorbs the laser radiation is a film comprising indium oxide and at least one element selected from the group consisting of tin and zinc.

13. The process of claim 1, wherein the surface power of the laser radiation on the multilayer is greater than or equal to 1 kW/cm$^2$.

14. The process of claim 1, wherein the laser radiation is emitted by a laser beam forming a line which simultaneously irradiates all or part of the width of the substrate.

15. The process of claim 14, wherein a relative movement is induced between the substrate coated with the film and the laser line, such that the difference between the respective speeds of the substrate and the laser is greater than or equal to 4 meters per minute.

16. The process of claim 1, wherein the wavelength of the laser radiation is between 530 and 1000 nm.

17. The process of claim 1, wherein, prior to the heat treatment, the multilayer comprises a thin film that at least partially absorbs the laser radiation such that the absorption of the multilayer at the wavelength of the laser radiation is such that the absorption of a clear glass substrate 4 mm in thickness coated with the multilayer at the wavelength of the laser radiation is greater than or equal to 15%.

18. The process of claim 1, wherein, prior to the heat treatment, the multilayer comprises a thin film that at least partially absorbs the laser radiation such that the absorption of the multilayer at the wavelength of the laser radiation is such that the absorption of a clear glass substrate 4 mm in thickness coated with the multilayer at the wavelength of the laser radiation is greater than or equal to 20%.

19. The process of claim 1, wherein, prior to the heat treatment, the multilayer comprises a thin film that at least partially absorbs the laser radiation such that the absorption of the multilayer at the wavelength of the laser radiation is such that the absorption of a clear glass substrate 4 mm in thickness coated with the multilayer at the wavelength of the laser radiation is greater than or equal to 25%.

20. The process of claim 1, wherein the heat-treated substrate does not undergo slow controlled cooling before it is cut or stored.

21. The process of claim 1, wherein the laser is positioned between an outlet of a vacuum chamber for a magnetron line and a device for storing the substrate in stacked form.

22. The process of claim 1, wherein the substrate comprises glass.

23. The process of claim 1, wherein the substrate comprises a polymeric organic substance.

24. The process of claim 1, wherein the heat-treating occurs for 1 second or less.

* * * * *